(12) United States Patent
Jung et al.

(10) Patent No.: US 7,839,366 B2
(45) Date of Patent: Nov. 23, 2010

(54) DISPLAY DEVICE

(75) Inventors: Kwang-Chul Jung, Seongnam-si (KR); Joon-Chul Goh, Seoul (KR); Joon-Hoo Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 996 days.

(21) Appl. No.: 11/559,181

(22) Filed: Nov. 13, 2006

(65) Prior Publication Data

US 2007/0145893 A1   Jun. 28, 2007

(30) Foreign Application Priority Data

Nov. 14, 2005   (KR)  ...................... 10-2005-0108758

(51) Int. Cl.
*G09G 3/30* (2006.01)
(52) U.S. Cl. ......................................... 345/81; 345/76
(58) Field of Classification Search .................. 345/48, 345/77, 84, 90, 98, 100, 175, 104, 173, 12, 345/204–207, 36, 55–58, 76–87; 313/504, 313/506; 257/79–84, 184–186; 349/12; 315/161.1–169.4
See application file for complete search history.

(56) References Cited

U.S. PATENT DOCUMENTS

| | | | | |
|---|---|---|---|---|
| 5,402,141 A | * | 3/1995 | Haim et al. | .................... 345/88 |
| 6,150,870 A | * | 11/2000 | Kang | .......................... 327/537 |
| 6,747,638 B2 | * | 6/2004 | Yamazaki et al. | ........... 345/207 |
| 2001/0052597 A1 | * | 12/2001 | Young et al. | ................... 257/59 |
| 2004/0207583 A1 | * | 10/2004 | Koo et al. | ...................... 345/82 |
| 2005/0082968 A1 | * | 4/2005 | Choi et al. | .................... 313/506 |
| 2005/0116937 A1 | * | 6/2005 | Choi et al. | .................... 345/173 |
| 2005/0179625 A1 | * | 8/2005 | Choi et al. | ..................... 345/76 |
| 2005/0195178 A1 | * | 9/2005 | Jo et al. | ....................... 345/204 |
| 2005/0275616 A1 | * | 12/2005 | Park et al. | .................... 345/102 |
| 2006/0030084 A1 | * | 2/2006 | Young | ......................... 438/149 |

FOREIGN PATENT DOCUMENTS

| | | |
|---|---|---|
| JP | 2001-171175 A1 | 6/2001 |
| JP | 2004-158686 A1 | 6/2004 |
| JP | 2004-310116 A1 | 11/2004 |
| JP | 2005-101621 A1 | 4/2005 |
| KR | 10-2002-0025978 A1 | 4/2002 |
| KR | 10-2005-0002606 A1 | 1/2005 |
| KR | 10-2005-0032948 A1 | 4/2005 |

* cited by examiner

*Primary Examiner*—Alexander Eisen
*Assistant Examiner*—Patrick Marinelli
(74) *Attorney, Agent, or Firm*—H.C. Park & Associates, PLC

(57) ABSTRACT

The present invention relates to a display device that includes a plurality of light-emitting elements that emit different-colored light, a plurality of driving transistors that supply driving currents to the light-emitting elements so that the light-emitting elements emit light, and a plurality of sense transistors that are exposed to the light-emitting elements and that generate a photocurrent on the basis of light emission of the light-emitting elements. The sense transistors corresponding to the light-emitting elements that emit light having different colors have different sizes from each other.

19 Claims, 6 Drawing Sheets

DISPLAY DEVICE

CROSS-REFERENCE TO RELATED APPLICATION

This application claims priority to and the benefit of Korean Patent Application No. 10-2005-0108758, filed on Nov. 14, 2005, which is hereby incorporated by reference for all purposes as if fully set forth herein.

BACKGROUND OF THE INVENTION

1. Field of the Invention

The present invention relates to a display device, and more particularly to a display device having a light-sensing function.

2. Discussion of the Background

Thin and light display devices are required to meet the recent demand for lighter and thinner personal computers and televisions. Thus, the bulkier and heavier cathode ray tubes (CRTs) are being replaced with flat panel display devices.

Examples of flat panel display devices include a liquid crystal display (LCD) device, a field emission display (FED) device, an organic light emitting diode (OLED) display, and a plasma display device (PDP).

Generally, an active flat panel display includes a plurality of pixels arranged in a matrix, and a pixel's light intensity is controlled on the basis of predetermined luminance information to display images. Among active flat panel displays, an OLED display is a self-emissive display device in which fluorescent organic materials are electrically excited to display images. Further, the OLED display has low power consumption, wide viewing angle, and high pixel response speed. Accordingly, the OLED display may be suitable for display of a high-definition motion picture.

Generally, the OLED display includes thin film transistors (TFT) controlling OLEDs. The TFTs may be polysilicon TFTs and amorphous silicon TFTs, depending on their active layer. Since OLED displays having polysilicon TFTs have various merits, they are widely used. However, since manufacturing polysilicon TFTs may be complicated, the display may be expensive to fabricate. Further, it may be difficult to obtain a large screen when using the OLED display.

On the other hand, an OLED display using amorphous silicon TFTs may be suitable for obtaining a large screen, and it may be manufactured by fewer manufacturing processes than an OLED display using polysilicon TFTs. However, when a positive DC voltage is continuously applied to a control terminal of the amorphous silicon TFT, a threshold voltage of the TFT changes. Hence, even when a uniform control voltage is applied to the TFT, a non-uniform current may flow in the OLED. Consequently, the luminance of the OLED display may be reduced, thereby causing image degradation. This eventually results in a reduced life span of the OLED display.

Therefore, various pixel circuits have been proposed to prevent image degradation by compensating for the variation of TFT threshold voltage. However, most pixel circuits include a plurality of TFTs, capacitors, and wiring. Accordingly, most pixel circuits have pixels with low aperture ratios.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention provides a display device that may prevent image degradation by compensating for variation of threshold voltages in amorphous silicon thin film transistors.

Additional features of the invention will be set forth in the description which follows, and in part will be apparent from the description, or may be learned by practice of the invention.

The present invention discloses a display device including a plurality of light-emitting elements that emit light having different colors, a plurality of driving transistors that supply a driving current to the light-emitting elements, and a plurality of sense transistors that are exposed to the light-emitting elements and generate a photocurrent according to light emission of the light-emitting elements. Here, the sizes of the sense transistors corresponding to the light-emitting elements, respectively, that emit light having different colors, are different from each other.

The present invention also discloses a display device including a plurality of light-emitting elements that emit light having different colors, a plurality of scanning signal lines that transmit scanning signal, a plurality of image data lines that transmit image data voltages, and a plurality of sense data lines that transmit sense reference voltages. A plurality of driving transistors have first terminals connected to a first voltage, second terminals connected to the light-emitting elements, and control terminals, and a plurality of sense transistors have first terminals connected to the sense data lines, second terminals connected to next scanning signal lines, and control terminals connected to a second voltage. The image data lines and the sense data lines cross the scanning signal lines. Here, the sizes of the sense transistors corresponding to the light-emitting elements, respectively, that emit light having different colors, are different from each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
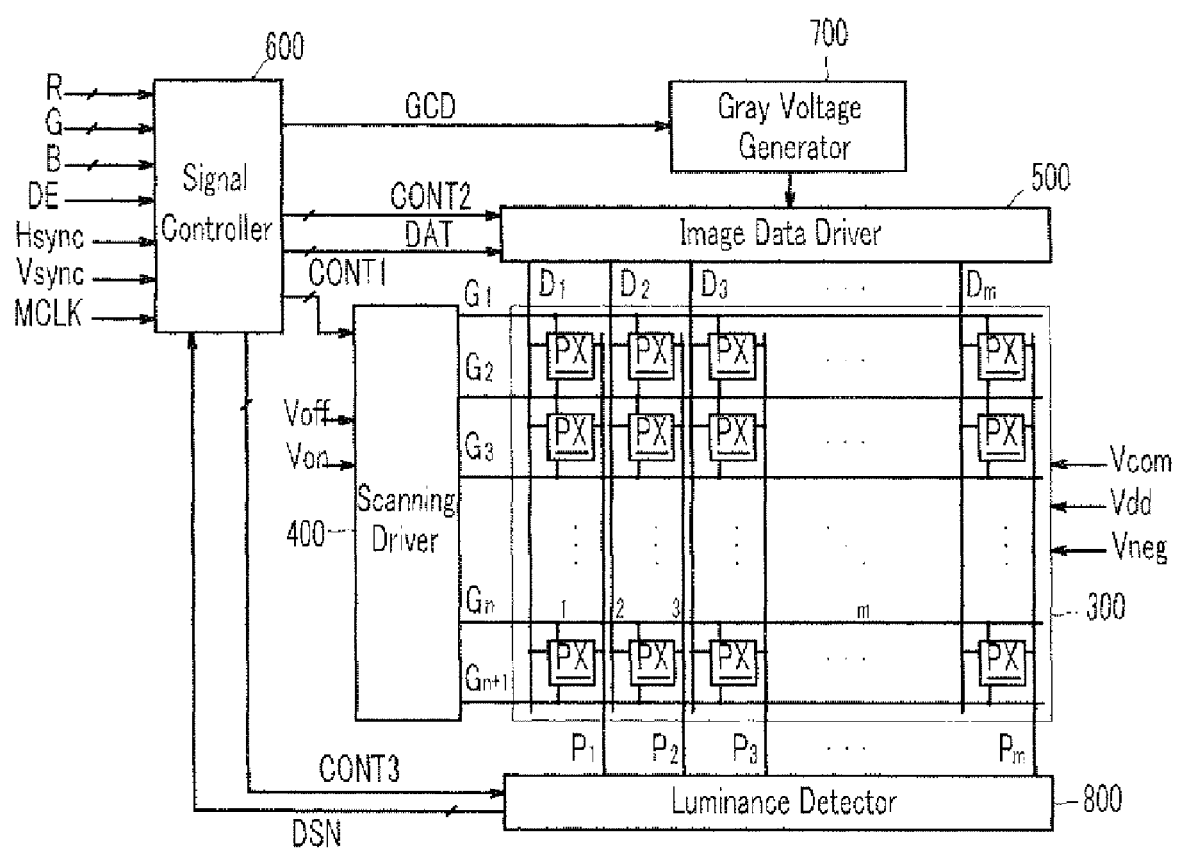
FIG. 1 is a block diagram of an organic light emitting diode (OLED) display according to an exemplary embodiment of the present invention.

The present invention will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art.

In the drawings, the size and relative sizes of layers, films, panels, regions, etc., may be exaggerated for clarity. Like reference numerals designate like elements throughout the specification. It will be understood that when an element such as a layer, film, region or substrate is referred to as being "on" or "connected to" another element, it can be directly on the other element or intervening elements may also be present. In contrast, when an element is referred to as being "directly on" or "directly connected to" another element, there are no intervening elements present.

An organic light emitting diode (OLED) display according to an exemplary embodiment of the present invention will be described below with reference to FIG. 1 and FIG. 2.

Figure 2:
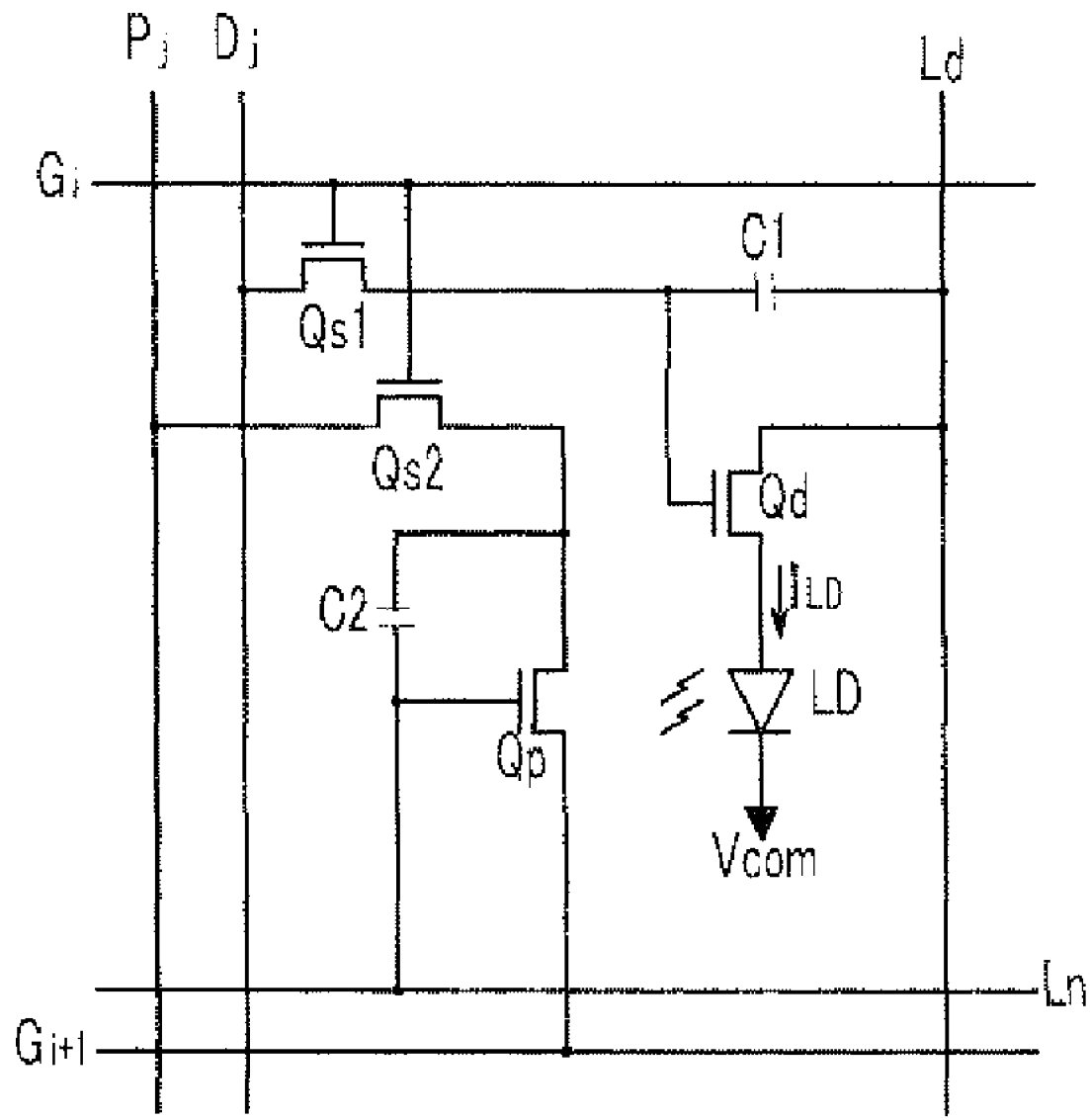
FIG. 2 is an equivalent circuit diagram of a pixel of an OLED display according to an exemplary embodiment of the present invention.

FIG. 1 is a block diagram of an OLED display according to an exemplary embodiment of the present invention, and FIG. 2 is an equivalent circuit diagram of a pixel of the OLED display according to an exemplary embodiment of the present invention.

Referring to FIG. 1 and FIG. 2, an OLED display according to an exemplary embodiment of the present invention includes a display panel 300, a scanning driver 400, an image data driver 500, and a luminance detector 800, which are connected to the display panel 300, a gray voltage generator 700, which is connected to the image data driver 500, and a signal controller 600 to control them.

The display panel 300 includes a plurality of signal lines $G_1$ to $G_{n+1}$, $D_1$ to $D_m$, $P_1$ to $P_m$, Ld, and Ln, and a plurality of pixels PX connected to the plurality of signal lines and arranged substantially in a matrix.

The signal lines are composed of a plurality of scanning signal lines $G_1$ to $G_{n+1}$ through which scanning signals are transmitted, a plurality of image data lines $D_1$ to $D_m$ through which image data signals, such as data voltages, are applied to the pixels, and a plurality of sense data lines $P_1$ to $P_m$ through which sense reference signals, such as sense reference voltages, are applied to the pixels. The scanning signal lines $G_1$ to $G_{n+1}$ extend substantially in a row direction so as to be substantially parallel with each other, and the image data lines $D_1$ to $D_m$ and the sense data lines $P_1$ to $P_m$ extend substantially in a column direction so as to be substantially parallel with each other.

The signal lines Ld and Ln are composed of a driving voltage line Ld through which driving voltages Vdd are applied to the pixels, and a control voltage line Ln through which control voltages Vneg are applied to the pixels. The signal lines Ld and Ln may extend in a row or column direction.

FIG. 2 shows a pixel PX that may be connected to a scanning signal line $G_i$ corresponding to an i-th pixel row and an image data line $D_j$ and a sense data line $P_j$ corresponding to a j-th pixel column. Each pixel PX includes an OLED LD, a driving transistor Qd, a sense transistor Qp, first and second capacitors C1 and C2, and first and second switching transistors Qs1 and Qs2.

The driving transistor Qd is an element having three terminals such as a thin film transistor (TFT), and a control terminal of the driving transistor Qd is connected to the first switching transistor Qs1 and the first capacitor C1. In addition, an input terminal and an output terminal of the driving transistor Qd are connected to the driving voltage line Ld and the OLED LD, respectively.

The first switching transistor Qs1 has three terminals, and a control terminal and an input terminal of the first switching transistor Qs1 are connected to the scanning signal line $G_i$ and the image data line $D_j$, respectively. In addition, an output terminal of the first switching transistor Qs1 is connected to the first capacitor C1 and the driving transistor Qd.

The first capacitor C1 is connected between the first switching transistor Qs1 and the driving voltage line Ld, and it may be charged with an image data voltage from the first switching transistor Qs1 and maintain the image data voltage for a predetermined period of time.

An anode and a cathode of the OLED LD are connected to the driving transistor Qd and a common voltage Vcom, respectively. The OLED LD emits light with various intensities on the basis of the intensity of a current $I_{LD}$ provided from the driving transistor Qd to display images. The intensity of the current $I_{LD}$ depends on the magnitude of a voltage Vgs between the control terminal and the output terminal of the driving transistor Qd.

The sense transistor Qp has three terminals. A control terminal of the sense transistor Qp is connected to the control voltage line Ln, and an input terminal of the sense transistor Qp is connected to the second switching transistor Qs2. Further, an output terminal of the sense transistor Qp is connected to a scanning signal line $G_{i+1}$ (hereinafter, referred to as a next scanning signal line) of the i+1-th pixel row. A channel semiconductor of the sense transistor Qp is provided below the OLED LD. As the OLED LD emits light, the channel semiconductor receives light from the OLED LD to generate a photocurrent and outputs the photocurrent to the output terminal on the basis of a voltage difference between the input terminal and the output terminal.

The second switching transistor Qs2 has three terminals. A control terminal and an input terminal of the second switching transistor Qs2 are connected to the scanning signal line $G_i$ and the sense data line $P_j$, respectively. Further, an output terminal of the second switching transistor Qs2 is connected to the input terminal of the sense transistor Qp. The second switching transistor Qs2 transmits the sense reference voltage from the sense data line $P_j$ to the second capacitor C2.

The second capacitor C2 is connected between the control terminal and the input terminal of the sense transistor Qp, and it is charged with the sense reference voltage supplied from the second switching transistor Qs2. Further, as photocurrent flows in the sense transistor Qp, the second capacitor C2 discharges a predetermined voltage corresponding to the photocurrent's intensity.

Hereinafter, the configuration of the OLED display will be described in detail with reference to FIG. 3, FIG. 4, and FIG. 6.

Figure 3:
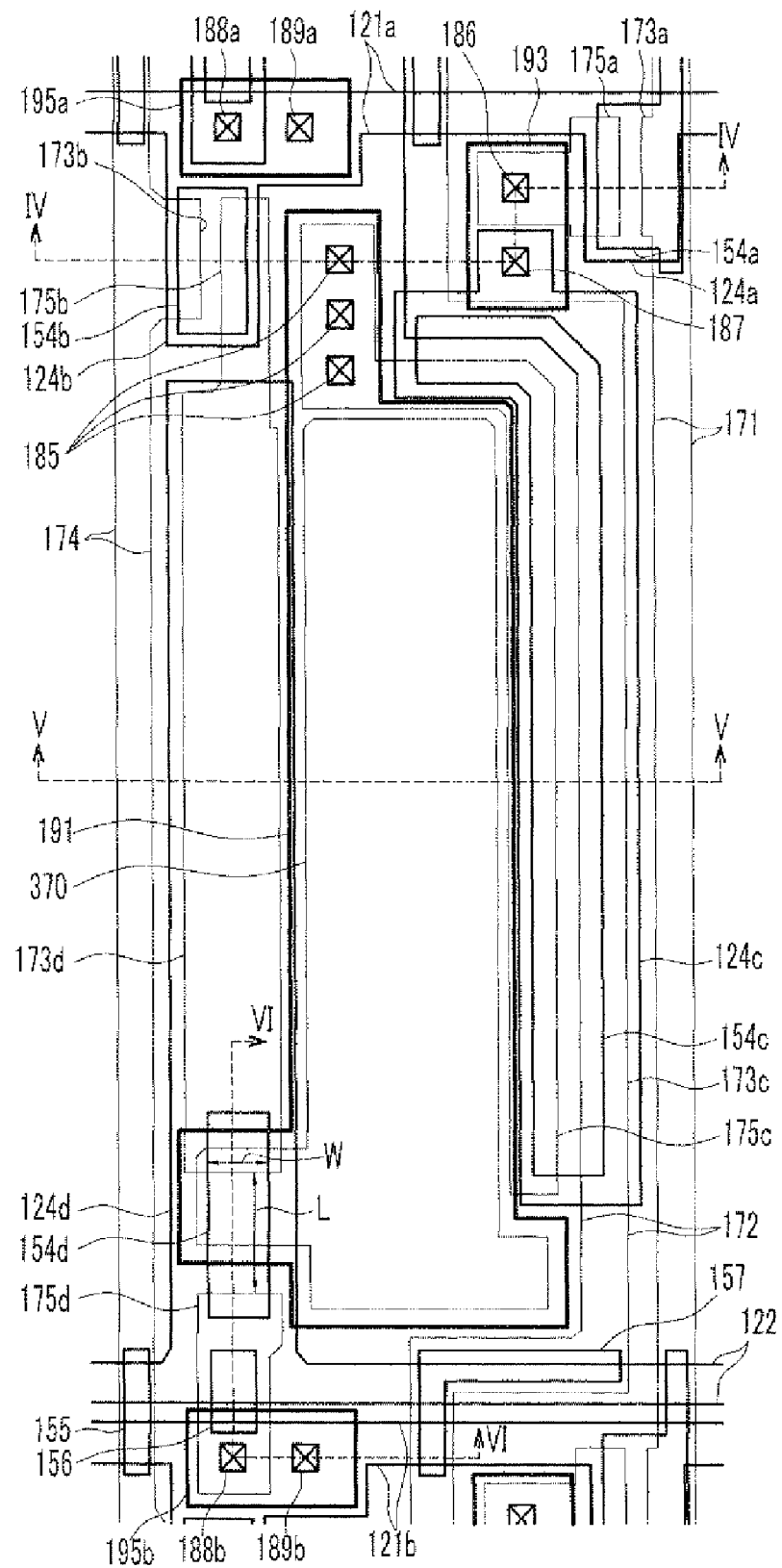
FIG. 3 is a layout view of an OLED display according to an exemplary embodiment of the present invention.
Figure 4:
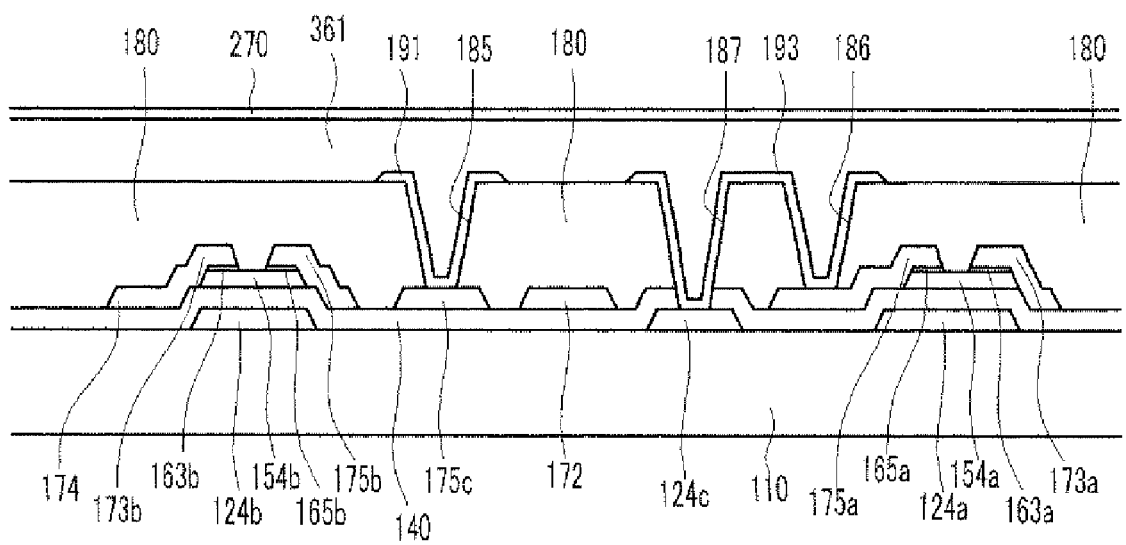
FIG. 4, FIG. 5, and FIG. 6 are cross-sectional views taken along lines IV-IV, V-V, and VI-VI of FIG. 3, respectively.
Figure 5:
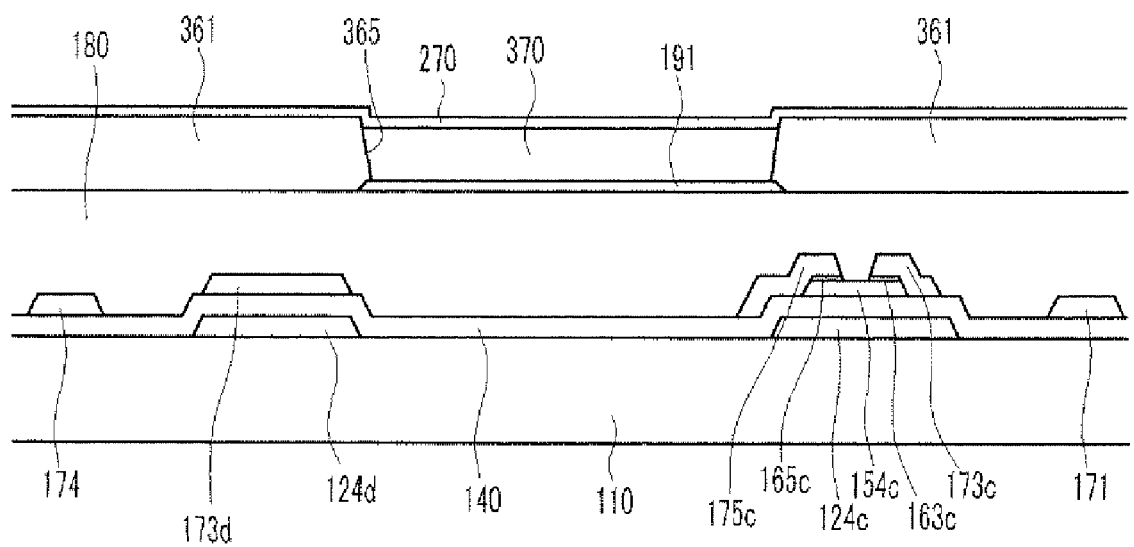
Figure 6:
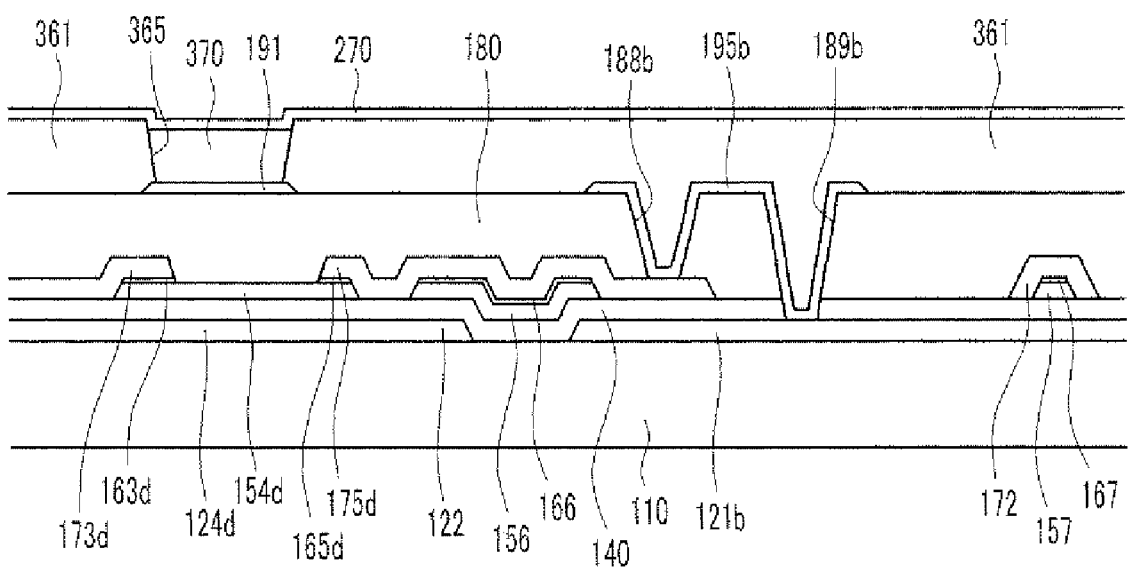

FIG. 3 is a layout view of the OLED display according to an exemplary embodiment of the present invention, and FIG. 4, FIG. 5, and FIG. 6 are cross-sectional views taken along lines IV-IV, V-V, and VI-VI of FIG. 3, respectively.

A plurality of gate conductors including a plurality of scanning signal lines 121a and 121b, a plurality of third control electrodes 124c, and a plurality of control voltage lines 122 are formed on an insulating substrate 110, which may be made of a material such as transparent glass, plastic, or the like. The scanning signal lines 121a and 121b include first and second control electrodes 124a and 124b, and the control voltage lines 122 include fourth control electrodes 124d. For better comprehension and ease of description, reference numeral 121b denotes a scanning signal line of a pixel row next to the pixel row on which the scanning signal line 121a is formed (i.e. next scanning signal line).

The scanning signal lines 121a and the control voltage lines 122 supply scanning signals and control voltages Vneg, respectively, and extend substantially in a transverse direction. The first and second control electrodes 124a and 124b extend downward from the right and left sides of the scanning signal lines 121a, respectively. The third control electrodes 124c are spaced apart from the scanning signal lines 121a and the control voltage lines 122. Further, the third control electrodes 124c extend substantially in a longitudinal direction and form a wide area. Fourth control electrodes 124d extend upward from the control voltage line 122 and form a wide area.

The gate conductors 121a, 121b, 122, and 124c may be made of aluminum (Al), an Al alloy, silver (Ag), an Ag alloy, copper (Cu), a Cu alloy, molybdenum (Mo), an Mo alloy, chromium (Cr), titanium (Ti), tantalum (Ta), or the like. The gate conductors 121a, 121b, 122, and 124c may have a multi-layered structure, such as two conductive layers (not shown) having different physical properties. One of the conductive layers may be made of a metal having low resistivity, for example Al, Ag, Cu, or their alloys, so as to reduce signal delay or voltage drop. The other conductive layer may be made of other material, particularly material having excellent physical, chemical, and electrical contact characteristics with indium tin oxide (ITO) and indium zinc oxide (IZO), for example Mo, an Mo alloy, Cr, Ti, Ta, and the like. Typical combinations of the above-mentioned conductive layers may include a lower layer made of Cr and an upper layer made of Al or an Al alloy, or a lower layer made of Al or an Al alloy and an upper layer made of Mo or an Mo alloy. However, the gate conductors 121a, 121b, 122, and 124c may be made of various metals and conductors.

Sides of the gate conductors 121a, 121b, 122, and 124c are inclined at an angle in the range of about 30 degrees to about 80 degrees with respect to the substrate 110.

A gate insulating layer 140, which may be made of silicon nitride (SiNx), silicon oxide (SiOx), or the like, is formed on the gate conductors 121a, 121b, 122, and 124c.

A plurality of first to seventh semiconductor islands 154a, 154b, 154c, 154d, 155, 156, and 157, which may be made of hydrogenated amorphous silicon (a-Si) or polycrystalline silicon, are formed on the gate insulating layer 140. The first to fourth semiconductor islands 154a to 154d are provided on the first to fourth control electrodes 124a to 124d, respectively.

Pairs of first ohmic contacts 163a and 165a, second ohmic contacts 163b and 165b, third ohmic contacts 163c and 165c, and fourth ohmic contacts 163d and 165d are formed on the first to fourth semiconductor islands 154a to 154d, respectively. Further, ohmic contacts 166 and 167 are formed on the semiconductor islands 156 and 157, respectively, and an ohmic contact (not shown) may also be formed on the semiconductor island 155. Each ohmic contact 163a to 163d, 165a to 165d, 166, and 167 has an island shape, and may be made of silicide or n+ hydrogenated a-Si or the like on which n-type impurities such as phosphorus are doped at a high concentration. The first to fourth ohmic contacts 163a, 165a, 163b, 165b, 163c, 165c, 163d, and 165d are disposed on the first to fourth semiconductor islands 154a to 154d, respectively, in the form of pairs.

Sides of the semiconductor islands 154a to 154d and 155 to 157 and the ohmic contacts 163a to 163d, 165a to 165d, 166, and 167 are inclined at an angle that ranges about 30 degrees to about 80 degrees with respect to the substrate 110.

A plurality of data conductors that include a plurality of image data lines 171, a plurality of driving voltage lines 172, a plurality of sense data lines 174, and a plurality of first to fourth output electrodes 175a, 175b, 175c, and 175d are formed on the ohmic contacts 163a to 163d, 165a to 165d, 166, and 167 and the gate insulating layer 140.

The image data lines 171 and the sense data lines 174 are used to supply image data voltages and sense reference voltages, respectively, and they extend substantially in the longitudinal direction so as to cross the scanning signal lines 121a and the control voltage lines 122. Each image data line 171 and each sense data line 174 includes a plurality of first and second input electrodes 173a and 173b extending toward the first and second control electrodes 124a and 124b, respectively.

The driving voltage lines 172 supply the driving voltage Vdd, and they extend substantially in the longitudinal direction so as to cross the scanning signal lines 121a and the control voltage lines 122. Each driving voltage line 172 includes a plurality of third input electrodes 173c extending toward the third control electrodes 124c. The driving voltage lines 172 overlap the third control electrodes 124c, and the driving voltage lines 172 may be connected to each other.

The first to fourth output electrodes 175a to 175d are spaced apart from each other, and they are also spaced apart from the image data lines 171, the sense data lines 174, and the driving voltage lines 172. The second output electrode 175b may be integrally formed with a fourth input electrode 173d, and it extends in the longitudinal direction to overlap the fourth control electrode 124d. The third output electrode 175c extends along the driving voltage lines 172 substantially in a vertical direction, and it overlaps the third control electrode 124c. The fourth output electrode 175d overlaps with and extends from the fourth control electrode 124d so as to reach the next scanning signal line 121b.

The first input electrode 173a and the first output electrode 175a face each other with respect to the first control electrode 124a therebetween, and the second input electrode 173b and the second output electrode 175b face each other with respect to the second control electrode 124b therebetween. Furthermore, the third input electrode 173c and the third output electrode 175c face each other with respect to the third control electrode 124c therebetween, and the fourth input electrode 173d and the fourth output electrode 175d face each other with respect to the fourth control electrode 124d therebetween.

The data conductors 171, 172, 174, and 175a to 175d may be made of a refractory metal, such as Mo, Cr, Ta, Ti, or their alloys, and they may have a multi-layered structure that includes conductive layers (not shown) made of a refractory metal or the like and conductive layers (not shown) made of a material having low resistance. A double-layered structure may include a lower layer made of Cr, Mo, or their alloys and an upper layer made of Al or an Al alloy. A triple-layered structure including a lower layer made of Mo or an Mo alloy, an intermediate layer made of Al or an Al alloy, and an upper layer made of Mo or an Mo alloy may be adopted as an example of the multi-layered structure. However, the data conductors 171, 172, 174, and 175a to 175d may be made of various metals or conductors other than the above-mentioned materials.

Like the gate conductors 121a, 121b, 122, and 124c, sides of the data conductors 171, 172, 174, and 175a to 175d may be inclined at an angle in the range of about 30 degrees to about degrees 80 with respect to the substrate 110.

The ohmic contacts 163a to 163d, 165a to 165d, 166, and 167 are provided only between the semiconductor islands 154a to 154d, 156, and 157 and the data conductors 171, 172, 174, and 175a to 175d to reduce the contact resistance between the semiconductor islands and the data conductors.

Surface profiles of the semiconductor islands 154a and 155 to 157, which are provided on the scanning signal line 121a/121b and the control voltage line 122, may be rounded to prevent disconnection of the data conductors 171, 172, 174, and 175d. The semiconductor islands 154a to 154d have exposed portions between the input electrodes 173a to 173d and the output electrodes 175a to 175d.

A passivation layer 180 is formed on the data conductors 171, 172, 174, and 175a to 175d, the exposed portions of the semiconductor islands 154a to 154d, and the gate insulating layer 140. The passivation layer 180 may be made of an inorganic insulator such as silicon nitride or silicon oxide, an organic insulator, or an insulator having low permittivity. The dielectric constants of the organic insulator and the insulator having low permittivity may be 4.0 or less, and the organic insulator and the insulator having low permittivity may be, for example, a-Si:C:O or a-Si:O:F formed by plasma enhanced chemical vapor deposition (PECVD). The passivation layer 180 may be made of an organic insulator having photosensitivity among organic insulators, and the surface of the passivation layer 180 may be substantially flat. The passivation layer 180 may have a double-layered structure that includes an inorganic lower layer and an organic upper layer, so as to have excellent insulating characteristics of an organic layer and protect the exposed portions of the semiconductor islands 154a to 154d.

The passivation layer 180 includes a plurality of contact holes 186, 185, and 188a/188b exposing the first, third, and fourth output electrodes 175a, 175c, and 175d, respectively. Further, the passivation layer 180 and the gate insulating layer 140 include a plurality of contact holes 187, 189a, and 189b exposing the third input electrode 124c and the scanning signal lines 121a and 121b, respectively.

A plurality of pixel electrodes 191 and a plurality of connecting members 193, 195a, and 195b are formed on the passivation layer 180. The pixel electrodes 191 and the connecting members 193, 195a, and 195b may be made of a transparent material such as ITO or IZO.

The pixel electrodes 191 are connected to the third output electrodes 175c through the contact holes 185. The connecting members 193 are connected to the first output electrodes 175a and the third control electrodes 124c through the contact holes 186 and 187, respectively, and the connecting members 195a are connected to the scanning signal lines 121a and the fourth output electrodes 175d of the previous pixel row through the contact holes 189a and 188a, respectively. In addition, the connecting members 195b are connected to the fourth output electrodes 175d and the next scanning signal line 121b through the contact holes 188b and 189b, respectively.

Furthermore, partitions 361 are formed on the passivation layer 180. The partitions 361 surround the pixel electrodes 191 along edges of each pixel electrode 191 like a bank to define openings 365, and may be made of an organic insulator or an inorganic insulator. The partitions 361 may also be made of a photoresist including a black pigment. In this case, the partitions 361 serve as light blocking members, and a process for forming the partitions may be simple.

Organic light emitting members 370 are formed in the openings 365. The organic light emitting members 370 are made of an organic material that emits light of one of the three primary colors of red, green, and blue. The OLED display spatially mixes the light emitted form the organic light emitting members 370 to display desired images.

Each organic light emitting member 370 may have a multi-layered structure that includes an emission layer (not shown) for emitting light and one or more auxiliary layers (not shown) for improving the emission layer's emission efficiency. The auxiliary layer(s) may be an electron transport layer (ETL) or a hole transport layer (HTL) for maintaining the balance between electrons and holes, or an electron injecting layer (EIL) or a hole injecting layer (HIL) for improving the injection of electrons and holes.

A common electrode 270, to which a common voltage Vcom is applied, is formed on the partitions 361 and the organic light emitting members 370. The common electrode 270 may be made of a reflective metal such as calcium (Ca), barium (Ba), magnesium (Mg), Al, Ag, and the like, or a transparent conductive material such as ITO or IZO.

In the OLED display, the first control electrode 124a connected to the scanning signal line 121a, the first input electrode 173a connected to the image data line 171, the first output electrode 175a, and the first semiconductor island 154a form the first switching transistor Qs1. The channel of the first switching transistor Qs1 is formed in the first semiconductor island 154a between the first input electrode 173a and the first output electrode 175a. Further, the second control electrode 124b connected to the scanning signal line 121a, the second input electrode 173b connected to the sense data line 174, the second output electrode 175b, and the second semiconductor island 154b form the second switching transistor Qs2. The channel of the second switching transistor Qs2 is formed in the second semiconductor island 154b between the second input electrode 173b and the second output electrode 175b. The third control electrode 124c connected to the first output electrode 175a, the third input electrode 173c connected to the driving voltage line 172, the third output electrode 175c connected to the pixel electrode 191, and the third semiconductor island 154c form the driving transistor Qd. Further, the channel of the driving transistor Qd is formed in the third semiconductor island 154c between the third input electrode 173c and the third output electrode 175c. The fourth control electrode 124d connected to the control voltage line 122, the fourth output electrode 175d, the fourth input electrode 173d connected to the second output electrode 175b, and the fourth semiconductor island 154d form the sense transistor Qp. Further, the channel of the sense transistor Qp is formed in the fourth semiconductor island 154d between the fourth input electrode 173d and the fourth output electrode 175d. The pixel electrode 191, the organic light emitting member 370, and the common electrode 270 form the OLED LD. Further, the pixel electrode 191 may serve as an anode, and the common electrode 270 may serve as a cathode. Alternatively, the pixel electrode 191 may serve as a cathode, and the common electrode 270 may serve as an anode. The third control electrode 124c and the driving voltage line 172 and the third output electrode 175c overlap to form the first capacitor C1. Further, the fourth control electrode 124d and the second output electrode 175b including the fourth input electrode 173d overlap to form the second capacitor C2.

The OLED display may emit light toward the substrate 110 so as to display images.

At least a portion of the fourth semiconductor island 154d overlaps with the organic light emitting member 370 so that it may be exposed to light emitted from the organic light emitting member 370. Conversely, the first to third semiconductor islands 154a to 154c are covered with the partitions 361 so that they are shielded from light emitted from the organic light emitting member 370.

The sense transistors Qp corresponding to the organic light emitting members 370 that emit red, green, and blue light have different sizes from each other. In other words, the sense transistors Qp in the red, green, and blue pixels have different sizes from each other. Specifically, at least one of the length L and width W of the channel of the fourth semiconductor island 154d in each color pixel PX are different from each other. Accordingly, even though the organic light emitting members 370 in color pixels PX emit light having the same luminance as other organic light emitting members 370, the intensity of the photocurrents that flow in the sense transistors Qp corresponding to the organic light emitting members 370 may be different from each other. In addition, the sizes of the second capacitors C2 corresponding to the color pixels PX are different from each other. As described above, the capacitors C2 are formed by the overlapping of the fourth control electrodes 124d and the second output electrodes 175b including the fourth input electrodes 173d. Thereby, the sizes of capacitors C2 may be changed based on the overlapping sizes of the fourth control electrodes 124d and the second output electrodes 175b.

The semiconductor islands 154a to 154d and 155, 156, and 157 may alternatively be made of polysilicon. In this case, they may include intrinsic regions (not shown) facing the control electrodes 124a to 124d and extrinsic regions (not shown) provided on both sides of the intrinsic region, respectively. The extrinsic regions are connected to the input electrodes 173a to 173d and the output electrodes 175a to 175d, and the ohmic contacts 163a to 163d and 165a to 165d may be omitted.

Further, the control electrodes 124a to 124d may be disposed on the semiconductor islands 154a to 154d, respectively. Here, the gate insulating layer 140 is still provided between the semiconductor islands 154a to 154d and the control electrodes 124a to 124d. The data conductors 171, 172, 174, and 175a to 175d may be provided on the gate insulating layer 140 and connected to the semiconductor islands 154a to 154d through contact holes (not shown) formed in the gate insulating layer 140. Alternatively, the data conductors 171, 172, 174, and 175a to 175b may be provided below the semiconductor islands 154a to 154d and connected to the semiconductor islands 154a to 154d.

Referring to FIG. 1, the gray voltage generator 700 generates a gray voltage group (or reference gray voltage group) related to the luminance of pixels PX on the basis of gamma control data GCD supplied from the signal controller 600. The gamma control data GCD may be a digital value corresponding to an image data voltage that corresponds to a maximum gray (hereinafter, referred to as a maximum image data voltage). Alternatively, the gamma control data GCD may have a plurality of digital values corresponding to each gray voltage and be stored in a lookup table (not shown) or the like. Furthermore, the gray voltage generator 700 can independently generate gray voltages on the basis of a separate gamma curve corresponding to each primary color. In this case, the gamma control data GCD may also be defined so as to correspond to each primary color.

The scanning driver 400 is connected to the scanning signal lines $G_1$ to $G_{n+1}$ of the display panel 300 so as to supply a scanning signal to the scanning signal lines $G_1$ to $G_{n+1}$. The scanning signal may be formed by combining a gate-on voltage Von, which is used to turn on the first and second switching transistors Qs1 and Qs2, with a gate-off voltage Voff, which is used to turn off the first and second switching transistors Qs1 and Qs2.

The image data driver 500 is connected to the image data lines $D_1$ to $D_m$ of the display panel 300. The image data driver selects gray voltages supplied from the gray voltage generator 700 and applies the gray voltages to the image data lines $D_1$ to $D_m$ as image data voltages. However, when the gray voltage generator 700 provides only predetermined reference gray voltages instead of providing voltages corresponding to all gray levels, the image data driver 500 may divide the reference gray voltages to generate gray voltages corresponding to all gray levels and select image data voltages among the gray voltages corresponding to all gray levels.

A luminance detector 800 is connected to the sense data lines $P_1$ to $P_m$ of the display panel 300 so as to apply sense reference voltages to the sense data lines $P_1$ to $P_m$. The sense reference voltage is applied to the second capacitor C2 through the second switching transistor Qs2, and the second capacitor C2 that is discharged to have a predetermined voltage is charged with the sense reference voltage. The luminance detector 800 detects a voltage difference between the voltage charged in the second capacitor C2 (i.e. the sense reference voltage) and a predetermined voltage, and it performs a predetermined signal process for the detected voltage to generate digital luminance information DSN. The luminance detector then transmits the digital luminance information DSN to the signal controller 600. Here, the detected voltage corresponds to the luminance of the light emitted from the OLED LD. The luminance detector 800 may detect a current flowing into the second capacitor C2 or an amount of electric charge charged in the second capacitor C2 to obtain luminance information.

The signal controller 600 controls the scanning driver 400, the image data driver 500, the luminance detector 800, and the like.

Each driving device 400, 500, 600, 700, and 800 may be directly mounted on the display panel 300 in the form of at least one integrated circuit (IC) chip or each device may be mounted on a flexible printed circuit film (not shown) and attached to the display panel 300 in the form of a tape carrier package (TCP). Further, the driving devices 400, 500, 600, 700, and 800 may be mounted on a separate printed circuit board (not shown). Alternatively, the driving devices 400, 500, 600, 700, and 800 may be integrated into the display panel 300, together with the signal lines $G_1$ to $G_{n+1}$ and $D_1$ to $D_m$ and the thin film transistors Qs1, Qs2, Qd, and Qp. Further, the driving devices 400, 500, 600, 700, and 800 may be integrated into a single chip. In this case, at least one of the driving devices 400, 500, 600, 700, and 800 or at least one circuit element of the driving devices 400, 500, 600, 700, and 800 may be provided outside the single chip.

The operation of the OLED display will be described in detail below.

The signal controller 600 receives input image signals R, G, and B and input control signals for controlling display thereof from an external graphics controller (not shown). The input image signals R, G, and B include luminance information for each pixel PX. The luminance may have a predetermined number of gray levels, for example $1,024 (=2^{10})$, $256 (=2^8)$, or $64 (=2^6)$ gray levels. The input control signals may be, for example, a vertical synchronizing signal Vsync, a horizontal synchronizing signal Hsync, a main clock signal MCLK, a data enable signal DE, and the like.

The signal controller 600 processes the input image signals R, G, and B on the basis of the input control signals according to the operation condition of the display panel 300 and the image data driver 500, and generates a scanning control signal CONT1, an image data control signal CONT2, a luminance detection control signal CONT3, gamma control data GCD, and the like. The signal controller 600 then transmits the scanning control signal CONT1 to the scanning driver 400, and transmits the image data control signal CONT2 and the processed image signals DAT to the image data driver 500. Each of the output image signals DAT is a digital signal having a predetermined value (or a gray level). Further, the signal controller 600 transmits the luminance detection control signal CONT3 to the luminance detector 800, and transmits the gamma control data GCD to the gray voltage generator 700.

The scanning control signal CONT1 includes a scanning start signal STV that instructs to start scanning and at least one clock signal that controls an output time of a gate-on voltage Von. The scanning control signal CONT1 may further include an output enable signal OE that defines the duration of the gate-on voltage Von.

The image data control signal CONT2 includes a horizontal synchronization start signal STH that informs the start of transmission of digital image signals DAT to pixels of one row, a load signal LOAD that instructs to apply image data voltages to the image data lines $D_1$ to $D_m$, and a data clock signal HCLK.

The image data driver 500 receives the image signals DAT for the pixels of one row according to the image data control signal CONT2 from the signal controller 600, and selects gray voltages corresponding to the image signals DAT. The image data driver 500 may then converts the image signals DAT into analog data voltages, and it applies the converted analog data voltages to the image data lines $D_1$ to $D_m$. Alternatively, the image data driver 500 may divide the reference gray voltage from the gray voltage generator 700 to generate gray voltages, and then may apply the gray voltages to the image data lines $D_1$ to $D_m$ as image data voltages.

The scanning driver 400 applies the gate-on voltage Von to the scanning signal lines $G_1$ to $G_n$ according to the scanning control signal CONT1 from the signal controller 600 so as to turn on the first switching transistors Qs1 that are connected to the scanning signal lines $G_1$ to $G_n$. Accordingly, the image data voltages applied to the image data lines $D_1$ to $D_m$ are applied to the control terminals of the driving transistors Qd and the first capacitors C1 through the turned-on first switching transistors Qs 1, and the first capacitors C1 are charged with the image data voltages. Even though the first switching transistors Qs1 turn off due to the scanning signals changing into the gate-off voltage Voff, the voltages charged in the first capacitors C1 may be constantly maintained during one frame. Therefore, the control terminal voltages of the driving transistors Qd may be constantly maintained.

The driving transistors Qd transmit output currents $I_{LD}$, which have an intensity that is controlled on the basis of the magnitude of the image data voltages, to the OLEDs LD, and the OLEDs LD emit light to have various light intensities on the basis of the intensity of the currents $I_{LD}$ to display images.

This process is repeatedly performed for every one horizontal period, which is also called "1H" and is equal to one period of the horizontal synchronizing signal Hsync and the data enable signal DE. In such a manner, the gate-on voltage Von may be sequentially applied to all scanning signal lines $G_1$ to $G_n$, and the image data signals may be applied to all of the pixels PX, such that images of one frame may be displayed.

In this case, the scanning signal line $G_{n+1}$ is connected to the sense transistors Qp of the last pixel row, and it is not connected to the switching transistors Qs1 and Qs2. Accordingly, it is not necessary to apply the gate-on voltage Von to the scanning signal line $G_{n+1}$. However, the gate-on voltage Von may be applied to the scanning signal line $G_{n+1}$ in order to create the same condition as the other pixel rows.

The luminance detector 800 applies the sense reference voltages to the sense data lines $P_1$ to $P_m$ on the basis of the luminance detection control signal CONT3 from the signal controller 600.

When a scanning signal applied to a scanning signal line $G_i$ is a gate-on voltage Von, the first and second switching transistors Qs1 and Qs2 of a corresponding pixel row turn on. Each of the sense reference voltages applied to the sense data lines $P_1$ to $P_m$ is applied to the input terminal of a corresponding sense transistor Qp and the second capacitor C2 through the turned-on second switching transistor Qs2, thereby charging the second capacitor C2 with the sense reference voltage.

After one horizontal period, a scanning signal applied to the scanning signal line $G_i$ changes into the gate-off voltage Voff, and a scanning signal applied to the scanning signal line $G_{i+1}$ changes into the gate-on voltage Von. Consequently, the second switching transistor Qs2 connected to the scanning signal line $G_i$ turns off. Therefore, the second capacitor C2 and the input terminal of the sense transistor Qp are floated, and the gate-on voltage Von is applied to the output terminal of the sense transistor Qp.

Again after one horizontal period, if a scanning signal applied to the scanning signal line $G_{i+1}$ changes into the gate-off voltage Voff, the output terminal voltage of the sense transistor Qp changes into the gate-off voltage Voff. Consequently, the photocurrent of the sense transistor Qp that is generated due to light emission of the OLED LD flows from the input terminal of the sense transistor Qp toward the output terminal thereof. Further, the sense reference voltage charged in the second capacitor C2 begins to discharge. The sense reference voltage is continuously discharged until the gate-on voltage Von is again applied to the scanning signal line $G_i$ at the next frame. The discharged voltage corresponds to the luminance of the light emitted from the OLED LD. When the scanning signal changes into the gate-on voltage Von, the sense reference voltage applied to the sense data lines $P_1$ to $P_m$ is again charged in the second capacitor C2. The luminance detector 800 detects a voltage difference between the voltage charged in the second capacitor C2 (i.e. the voltage remaining after discharge of the sense reference voltage according to the photocurrent) and the sense reference voltage, and generates the digital luminance information DSN corresponding to the luminance of the light emitted from the OLED LD. Then, the luminance detector 800 transmits the digital luminance information DSN to the signal controller 600.

The signal controller 600 generates the gamma control data GCD on the basis of the difference between a target luminance and a measured luminance, and transmits the gamma control data GCD to the gray voltage generator 700. The gamma control data GCD corresponding to the difference between the target luminance and the measured luminance may be stored in a lookup table (not shown) or the like, and the measured luminance can be obtained from the digital luminance information DSN. For example, a maximum image data voltage can be set in the range of about 10V to about 15 V. Further, when the luminance is reduced, it may be possible to compensate for the reduced luminance by increasing the gray voltage through the increase of the maximum image data voltage. Alternatively, it may be possible to compensate for the reduced luminance by changing the gray voltage itself. Alternatively, luminance may be separately measured for each primary color in order to compensate for the reduced luminance.

Even if luminance is reduced due to the change of a threshold voltage as described above, it may be possible to compensate for the reduced luminance through luminance detection using the sense transistor Qp or the like and the change of a gray voltage.

Since it typically takes a relatively long time for the threshold voltage to change, luminance detection and luminance compensation can be performed at predetermined intervals rather than every frame. Furthermore, it is not necessary to detect the luminance for all pixels PX of the display panel 300. In other words, sample pixels may be selected from among all pixels, and luminance of the sample pixels may be detected to generate gamma control data GCD on the basis of the detected luminance.

The second capacitor C2 may be designed so as to be fully charged with the sense reference voltage during one horizontal period. Further, the sense transistor Qp and the second capacitor C2 may be designed so that a voltage to be discharged according to the photocurrent is smaller than the sense reference voltage. The sense reference voltage and the gate-off voltage Voff are set so that photocurrent flows from the input terminal of the sense transistor Qp to the output terminal thereof. For example, the sense reference voltage may be set to about 5 V, and the gate-off voltage Voff may be set to about −8 V.

The sensitivity of the sense transistor for each color pixel in the OLED display according to an exemplary embodiment of the present invention will be described in detail below with reference to FIG. 7.

Figure 7:
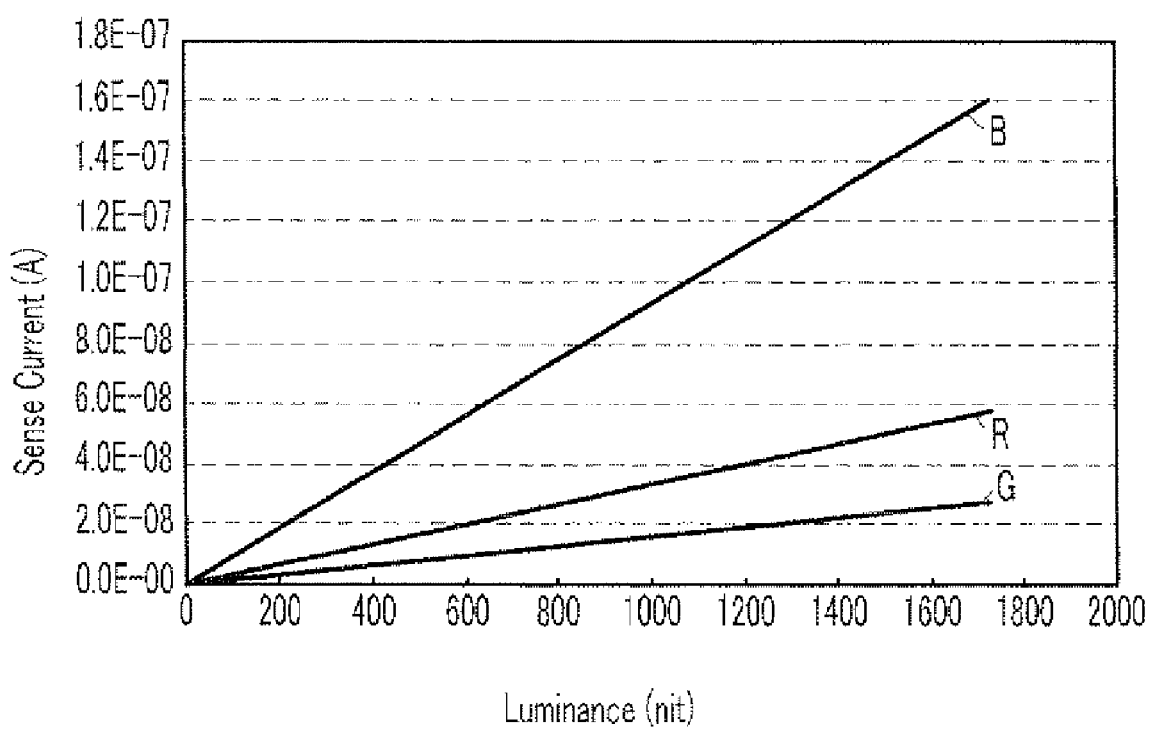
FIG. 7 is a graph showing sensitivity of a sense transistor with respect to each color in an OLED display according to an exemplary embodiment of the present invention.

FIG. 7 is a graph showing sensitivity of a sense transistor with respect to each color in an OLED display according to an exemplary embodiment of the present invention.

In this case, the sizes of the sense transistor Qp and the second capacitor C2 corresponding to each of the primary color pixels, for example red, green, and blue pixels, are set to be equal to those of the others. While the luminance of the light emitted from the OLED LD for each primary color is changed, the photocurrent of each sense transistor Qp is measured.

Referring to FIG. 7, the sensitivity indicating the luminance variation with respect to the photocurrent variation is reduced in order of the blue pixel, the red pixel, and the green pixel. The ratio of the reduction in luminance is about 9:3:2. However, the ratio is not limited thereto, and may be changed depending on other design factors. Accordingly, if the size of the sense transistor Qp for each color is properly adjusted to be different from each other, it may be possible to adjust the sensitivity for each color to be similar to each other. For example, if the ratio of the size of the sense transistor for each color is set to $9^{-1}:3^{-1}:2^{-1}$, it may be possible to adjust the sensitivity for each color to be substantially equal to each other.

According to an exemplary embodiment of the present invention, the sense transistors Qp in different colored pixels have different sizes from each other, and the sizes of the second capacitors C2 corresponding to the sizes of the sense transistors can be adjusted to be different from each other.

The size of the second capacitor C2 for each color has the same order as that of the sense transistor Qp, and the second capacitors C2 may increase in size in order of the blue pixel, the red pixel, and the green pixel.

Consequently, the sizes of the sense transistor Qp and the second capacitor C2 in the blue and red pixels may be reduced on the basis of the green pixel, which has a low sensitivity. For this reason it may be possible to increase the opening ratios of the blue and red pixels more than that of the green pixel, and to increase the opening ratio of the blue pixel more than that of the red pixel.

Generally, the blue pixel's efficiency is lower than those of the red and the green pixels. Accordingly, if the sense transistor Qp and the second capacitor C2 are designed as described above, the opening ratio of the blue pixel may be improved. Therefore, it may be possible to compensate for the efficiency of the blue pixel.

When the sizes of the sense transistor Qp and the second capacitor C2 for each color are optimized so as to correspond to the sensitivity of the photocurrent, it may be possible to optimize the opening ratio of each color pixel and to compensate for the efficiency of each color pixel.

Although an OLED display has been shown and described above, exemplary embodiments of the present invention may be applied to other types of flat panel displays, such as a liquid crystal display. That is, the sense transistor Qp and the second capacitor C2 may be applied to sense light emitted from a backlight of a liquid crystal display. Further, the sense transistor Qp and the second capacitor C2 may be applied to a plasma display device.

As described above, according to an exemplary embodiment of the present invention, since a display device includes sense transistors for sensing light to compensate for reduced luminance, it may be possible to compensate for variation of a threshold voltage of a driving transistor. Additionally, it may be possible to increase the opening ratios of pixels by adjusting the sizes of the sense transistor and capacitor.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
   a plurality of light-emitting elements that emit light having different colors;
   a plurality of scanning signal lines that transmit scanning signals;
   a plurality of sense data lines that transmit sense reference voltages, the sense data lines crossing the scanning signal lines;
   a plurality of driving transistors that supply a driving current to the light-emitting elements; and
   a plurality of sense transistors that are exposed to the light-emitting elements and generate a photocurrent according to light emission of the light-emitting elements;
   wherein the sense transistors corresponding to the light-emitting elements that emit light having different colors have different sizes from each other,
   wherein the different colors comprise red, green and blue, wherein the sense transistors that correspond to the light-emitting elements that emit a blue light are smaller than the sense transistors that correspond to the light emitting elements that emit a red light,
   wherein the sense transistors that correspond to the light-emitting elements that emit the red light are smaller than the sense transistors that correspond to the light-emitting elements that emit a green light,
   wherein the plurality of driving transistors comprises first terminals connected to a first voltage line, second terminals connected to the plurality of light emitting elements, and control terminals, and
   wherein the plurality of sense transistors comprising first terminals connected to sense data lines, second terminals connected to next scanning signal lines, and control terminals connected to a second voltage line.

2. The display device of claim 1, wherein channel lengths of the sense transistors are different from each other.

3. The display device of claim 1, wherein channel widths of the sense transistors are different from each other.

4. The display device of claim 1, further comprising:
a plurality of first capacitors that are charged with image data voltages corresponding to the driving current; and
a plurality of second capacitors that are charged with sense reference voltages and that discharge voltages corresponding to the photocurrent.

5. The display device of claim 4, wherein the second capacitors corresponding to the light-emitting elements that emit light having different colors have different sizes from each other.

6. The display device of claim 4, wherein
the second capacitors that correspond to the light-emitting elements that emit a blue light are smaller than the second capacitors that correspond to the light-emitting elements that emit a red light and the second capacitors that correspond to the light-emitting elements that emit a green light.

7. The display device of claim 4, further comprising:
a plurality of first switching transistors that transmit the image data voltages to the first capacitors and the driving transistors in response to scanning signals; and
a plurality of the second switching transistors that transmit the sense reference voltages to the second capacitors and the sense transistors in response to the scanning signals.

8. The display device of claim 7, further comprising:
a plurality of image data lines to transmit the image data voltages, the image data lines being connected to the first switching transistors,
wherein the scanning signal lines are connected to the first switching transistors and the second switching transistors, and
wherein the sense data lines are connected to the second switching transistors.

9. The display device of claim 8, further comprising:
a luminance detector connected to the sense data lines to supply the sense reference voltages to the sense data lines, the luminance detector to generate luminance information about the light-emitting elements according to the magnitude of voltages charged in the second capacitors.

10. A display device, comprising:
a plurality of light-emitting elements that emit light having different colors;
a plurality of scanning signal lines that transmit scanning signals;
a plurality of image data lines that transmit image data voltages, the image data lines crossing the scanning signal lines;
a plurality of sense data lines that transmit sense reference voltages, the sense data lines crossing the scanning signal lines;
a plurality of driving transistors comprising first terminals connected to a first voltage line, second terminals connected to the light-emitting elements, and control terminals;
and a plurality of sense transistors comprising first terminals connected to the sense data lines, second terminals connected to next scanning signal lines, and control terminals connected to a second voltage line,
wherein the sense transistors corresponding to the light-emitting elements that emit light having different colors have different sizes from each other, and
wherein the plurality of sense transistors are exposed to the light-emitting elements and generate a photocurrent according to light emission of the light-emitting elements.

11. The display device of claim 10, wherein channel lengths of the sense transistors are different from each other.

12. The display device of claim 10, wherein channel widths of the sense transistors are different from each other.

13. The display device of claim 10, wherein the different colors comprise red, green, and blue, and
the sense transistors that correspond to the light-emitting elements that emit a blue light are smaller than the sense transistors that correspond to the light-emitting elements that emit a red light and the sense transistors that correspond to the light-emitting elements that emit a green light.

14. The display device of claim 10, further comprising:
a plurality of first capacitors connected between the first terminals and the control terminals of the driving transistors; and
a plurality of second capacitors connected between the first terminals and the control terminals of the sense transistors.

15. The display device of claim 14, wherein the second capacitors corresponding to the light-emitting elements that emit light having different colors have different sizes from each other.

16. The display device of claim 14, wherein the different colors comprise red, green, and blue, and
the second capacitors that correspond to the light-emitting elements that emit a blue light are smaller than the second capacitors that correspond to the light-emitting elements that emit a red light and the second capacitors that correspond to the light-emitting elements that emit a green light.

17. The display device of claim 10, further comprising:
a plurality of first switching transistors that operate in response to the scanning signals, the first switching transistors being connected between the control terminals of the driving transistors and the image data lines; and
a plurality of second switching transistors that operate in response to the scanning signals, the second switching transistors being connected between the first terminals of the sense transistors and the sense data lines.

18. The display device of claim 1, wherein channel lengths of the sense transistors are different from each other, and channel widths of the sense transistors are different from each other.

19. The display device of claim 10, wherein channel lengths of the sense transistors are different from each other, and channel widths of the sense transistors are different from each other.

* * * * *